(12) United States Patent  (10) Patent No.: US 8,575,012 B2
Haneda  (45) Date of Patent: Nov. 5, 2013

(54) SEMICONDUCTOR DEVICE PRODUCTION METHOD AND SEMICONDUCTOR DEVICE

(75) Inventor: Masaki Haneda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 190 days.

(21) Appl. No.: 13/096,047

(22) Filed: Apr. 28, 2011

(65) Prior Publication Data

US 2012/0032281 A1 Feb. 9, 2012

(30) Foreign Application Priority Data

Aug. 4, 2010 (JP) .................................. 2010-175727

(51) Int. Cl.
*H01L 21/28* (2006.01)

(52) U.S. Cl.
USPC ........... 438/573; 438/141; 438/151; 438/197; 438/216; 438/287; 257/402; 257/407; 257/410; 257/411; 257/412; 257/E21.3; 257/E29.255; 257/E21.177; 257/E21.19; 257/E21.409; 257/E21.623

(58) Field of Classification Search
None
See application file for complete search history.

(56) References Cited

U.S. PATENT DOCUMENTS

2006/0145158 A1* 7/2006 Noguchi et al. ................ 257/66
2010/0081262 A1* 4/2010 Lim et al. ...................... 438/479

FOREIGN PATENT DOCUMENTS

JP 2006-086272 A 3/2006

OTHER PUBLICATIONS

Journal of the Japan Institute of Metals, 1969, vol. 8 No. 49.

* cited by examiner

*Primary Examiner* — Fei Fei Yeung Lopez
(74) *Attorney, Agent, or Firm* — Westerman, Hattori, Daniels & Adrian, LLP

(57) ABSTRACT

A semiconductor device production method includes: forming an insulating film on a semiconductor substrate, forming a concave portion in the insulating film, forming a gate insulating film at bottom of the concave portion, the bottom being on the semiconductor substrate; covering an inner wall surface of the concave portion and a top face of the insulating film with a first gate electrode film that is made of an electrically conductive material containing a first metal; covering the first gate electrode film with a covering film of a material having a second melting point higher than a first melting point of the electrically conductive material, leaving part of the side face of the concave portion uncovered; and performing heat treatment following the covering film formation to allow the first gate electrode film to reflow.

15 Claims, 19 Drawing Sheets

SEMICONDUCTOR DEVICE PRODUCTION METHOD AND SEMICONDUCTOR DEVICE

CROSS-REFERENCE TO RELATED APPLICATION

This application is based upon and claims the benefit of priority of the prior Japanese Patent Application No. 2010-175727, filed on Aug. 4, 2010, the entire contents of which are incorporated herein by reference.

FIELD

The embodiments discussed herein are related to a semiconductor device production method and a semiconductor device.

BACKGROUND

In some available methods of producing a MOS transistor gate electrode (see, for instance, Japanese Unexamined Patent Publication (Kokai) No. 2006-86272), an electrically conductive material is embedded in a concave portion (hereinafter referred to as gate trench) formed in an insulating film. To produce MOS transistors with a finer structure, narrower gate trenches are needed in recent years, making it difficult to embed an electrically conductive material in them.

SUMMARY

According to one aspect of the invention, a semiconductor device production method includes: forming an insulating film on a semiconductor substrate, forming a concave portion in the insulating film, forming a gate insulating film at bottom of the concave portion, the bottom being on the semiconductor substrate; covering an inner wall surface of the concave portion and a top face of the insulating film with a first gate electrode film that is made of an electrically conductive material containing a first metal; covering the first gate electrode film with a covering film of a material having a second melting point higher than a first melting point of the electrically conductive material, leaving part of the side face of the concave portion uncovered; and performing heat treatment following the covering film formation to allow the first gate electrode film to reflow.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
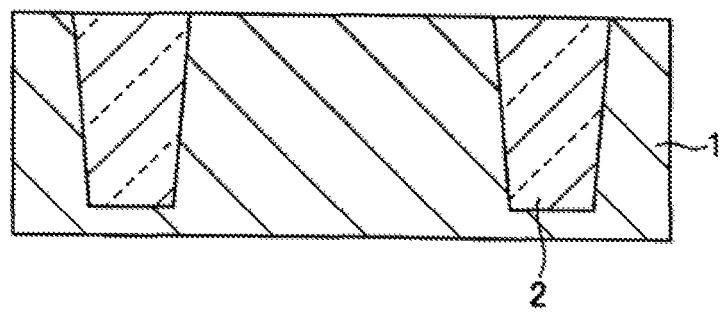
FIGS. 1A to 1V illustrate schematic cross sections that illustrate major steps of the semiconductor device production method in Embodiment 1.

Described first is the semiconductor device production method of Embodiment 1 of the invention. FIGS. 1A to 1V illustrate schematic cross sections at major steps of the semiconductor device production method of Embodiment 1.

See FIG. 1A. An element separation insulating film 2 is formed on a silicon substrate (semiconductor substrate) 1 by, for instance, shallow trench isolation (STI).

Figure 1B:
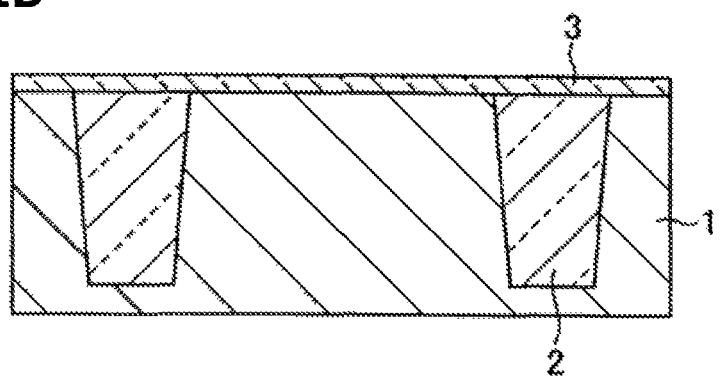

See FIG. 1B. For instance, a silicon oxynitride film with a thickness of 0.3 nm to 1 nm (0.7 nm for instance) is grown on a silicon substrate 1 by thermal oxynitriding with NO gas to produce a base insulating film 3 of a laminated gate insulating film having a laminated structure consisting of the base insulating film and a high dielectric constant insulating film. A silicon oxide film may be used as the base insulating film 3.

Figure 1C:
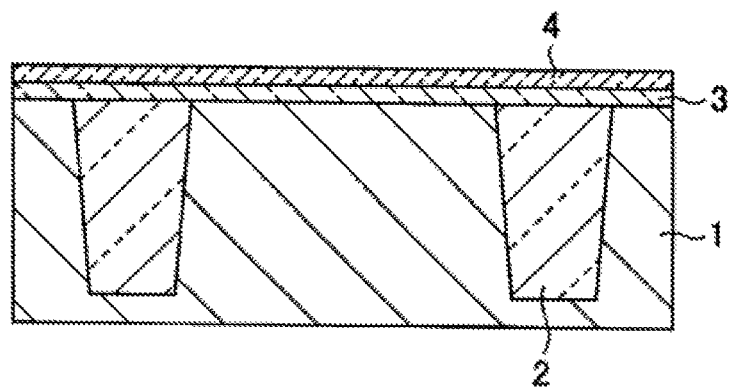

See FIG. 1C. For instance, a hafnium oxide film with a thickness of 0.5 nm to 3 nm (2 nm for instance) is deposited on the base insulating film 3 by atom layer deposition (ALD) to form the high dielectric constant insulating film 4 of the laminated gate insulating film. To form the hafnium oxide film, other film production methods such as chemical vapor deposition (CVD) and physical vapor deposition (PVD) may be used instead of ALD.

A high dielectric constant insulating film as referred to here is an insulating film of a material, such as hafnium oxide, that contains Hf, or Zr, or Ta, or Al, in addition to oxygen, and that has a dielectric constant higher than that of $SiO_2$.

It is noted that the gate insulating film is not limited to the above-mentioned laminated structure. A hafnium oxide material used as the high dielectric constant insulating film may contain HfZr oxide or HfSi oxide as hafnium oxide.

After the production of the hafnium oxide film, conditioning of the hafnium oxide film may be carried out by performing heat treatment (for 5 seconds for instance) at 500° C. to 1050° C. (at 850° C. for instance). One or more of the group of Zr, Ti, Al, Si, Ta, La, Y, and Mg may be added to the hafnium oxide film in a content range where the threshold voltage is controllable. Nitrogen plasma treatment may also be performed to nitride it by annealing at 750° C. to 1,100° C.

Figure 1D:
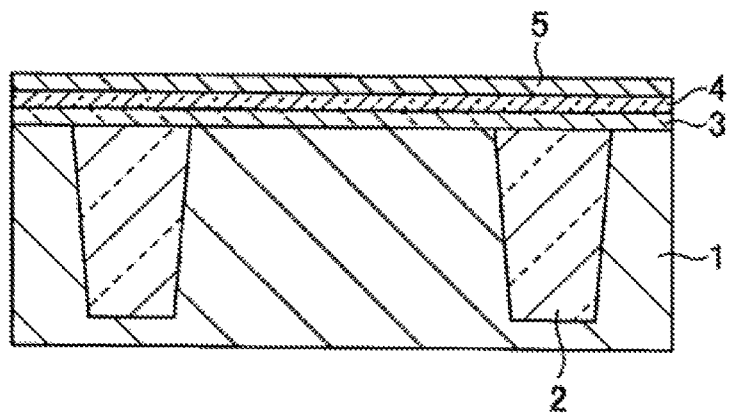

See FIG. 1D. For instance, a titanium nitride film with a thickness of 3 nm to 10 nm (5 nm for instance) is deposited on the high dielectric constant insulating film 4 by PVD to form a work function metal (WFM) film 5 that acts to adjust the threshold voltage. Specific methods for producing the titanium nitride film include reactive sputtering using Ti target, Ar gas, and $N_2$ gas. The reactive sputtering may be carried out using $N_2$ gas alone. In view of the work function, a Ti—Al alloy, which contains Al, may be used as the target. There are other useful film production methods including metal-organic (MO) CVD, thermal CVD, and ALD.

Figure 1E:
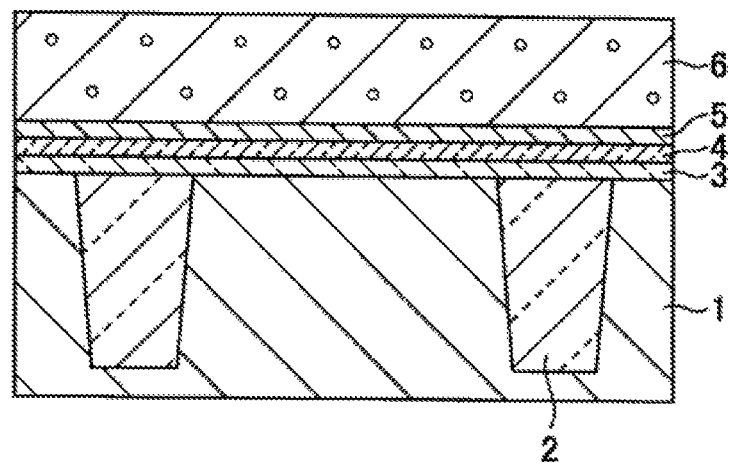

See FIG. 1E. For instance, a polysilicon film with a thickness of 10 nm to 100 nm (50 nm for instance) is deposited on the WFM film 5 by CVD to form a dummy gate electrode film 6. Here, an amorphous silicon film may be used as the dummy gate electrode film 6.

Figure 1F:
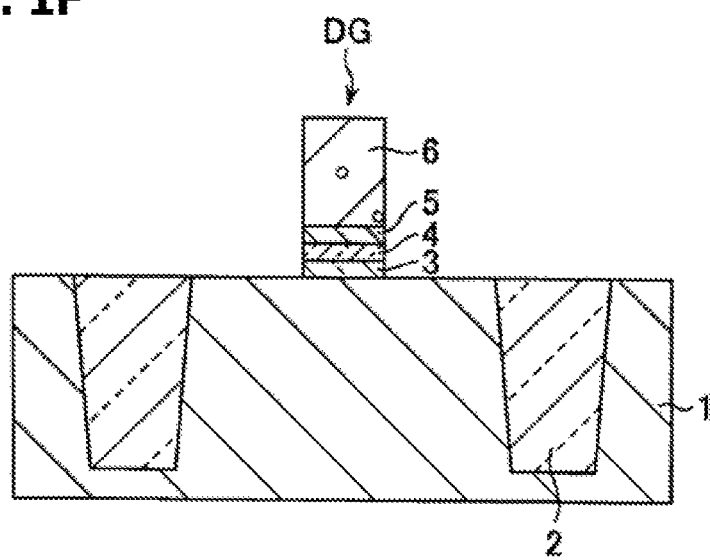

See FIG. 1F. The dummy gate electrode film 6, WFM film 5, high dielectric constant insulating film 4, and base insulating film 3 are patterned by photolithography and dry etching to form a dummy insulation gate electrode structure DG. The dummy insulation gate electrode structure DG is assumed to have a width of, for instance, 100 nm or less, for instance 30 nm. The etching gas to be used, for instance, may be $CF_4$, $Cl_2$, and $N_2$ for a dummy gate electrode film 6 of polysilicon and a WFM film 5 of titanium nitride, while $BCl_3$ and Ar are used for a high dielectric constant insulating film 4 of hafnium oxide and a base insulating film 3 of silicon oxynitride.

Figure 1G:
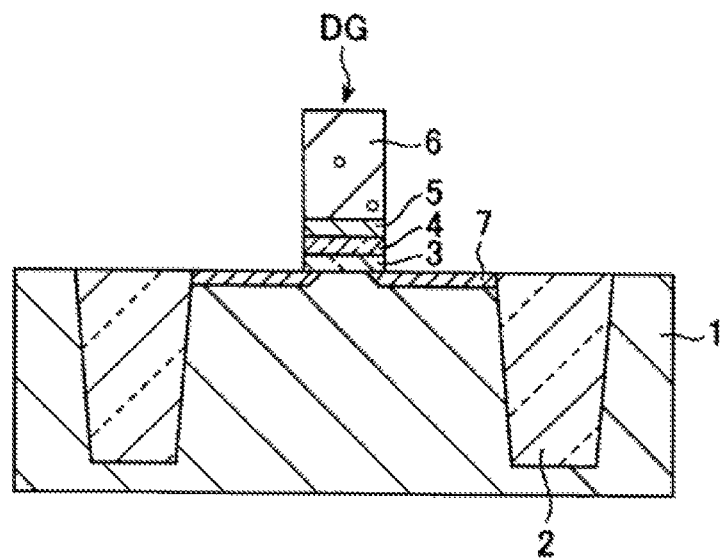

See FIG. 1G. Using the dummy insulation gate electrode structure DG as mask, impurities are injected to form a low concentration region 7.

Figure 1H:
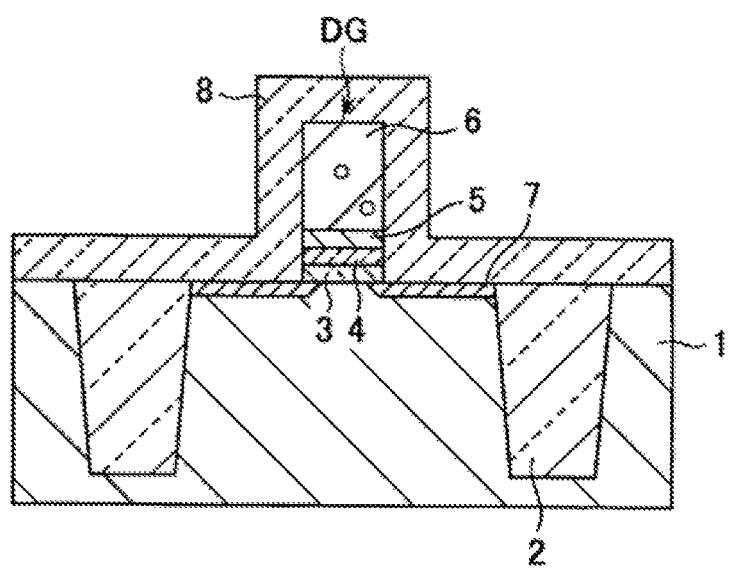

See FIG. 1H. To cover the dummy insulation gate electrode structure DG, for instance, a nitride silicon film 8 with a thickness of 50 nm is deposited by CVD on the silicon substrate 1.

Figure 1I:
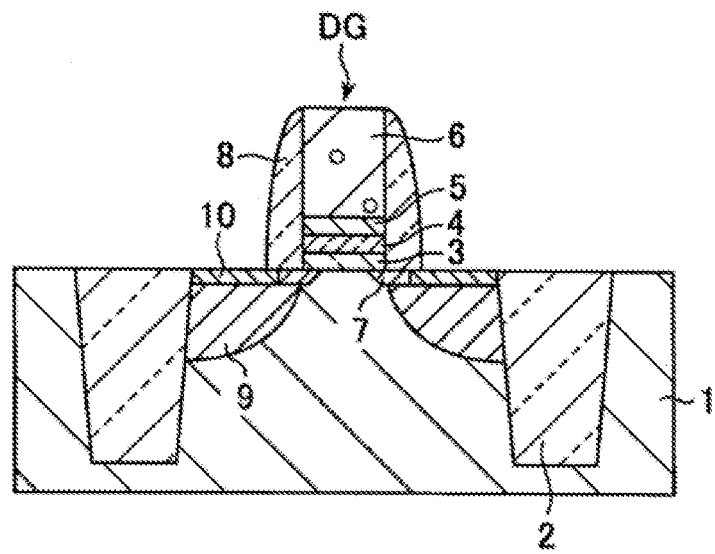

See FIG. 1I. The nitride silicon film 8 is etched anisotropically to leave a side wall spacer 8 on the side wall of the dummy insulation gate electrode structure DG. Using the dummy insulation gate electrode structure DG and the side wall spacer 8 as masks, impurities were injected to form a high concentration source/drain region 9. A silicide film 10 is formed on the surface of the high concentration source/drain region 9.

Figure 1J:
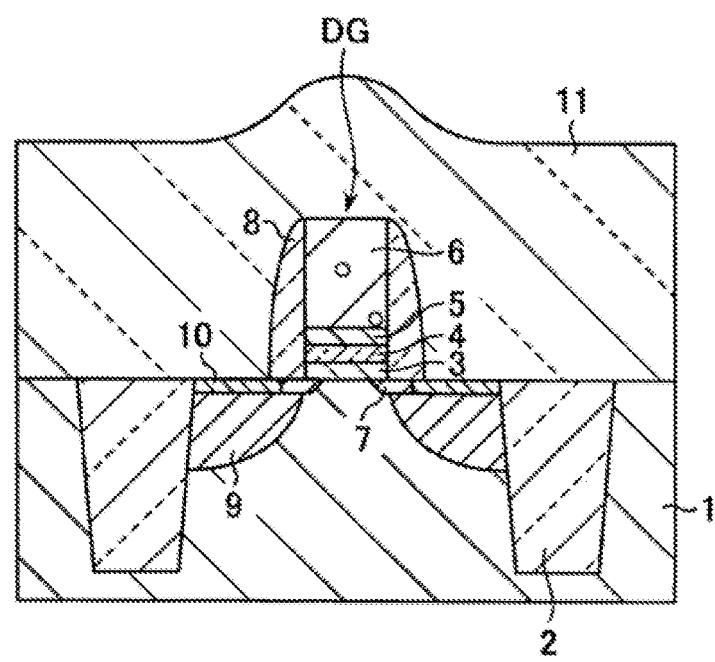

See FIG. 1J. To cover the dummy insulation gate electrode structure DG, for instance, a silicon oxide film with a thickness of 600 nm is deposited on the silicon substrate 1 by thermal CVD to form an interlayer insulating film 11. High density plasma CVD may be used for the formation of the silicon oxide film. The interlayer insulating film 11 may be doped with such as P and B. The material to be used to form the interlayer insulating film 11 may be selected from other various generally known low dielectric constant materials.

Figure 1K:
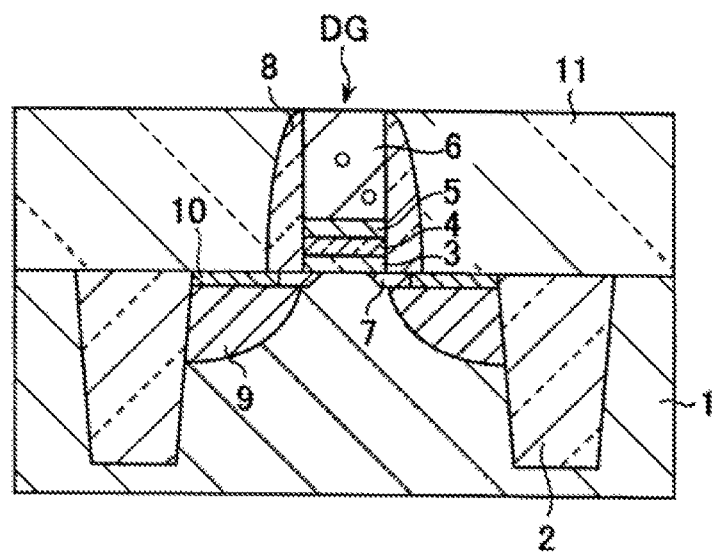

See FIG. 1K. The top portion of the interlayer insulating film 11 is removed by chemical mechanical polishing (CMP) to expose the top face of the dummy gate electrode 6.

Figure 1L:
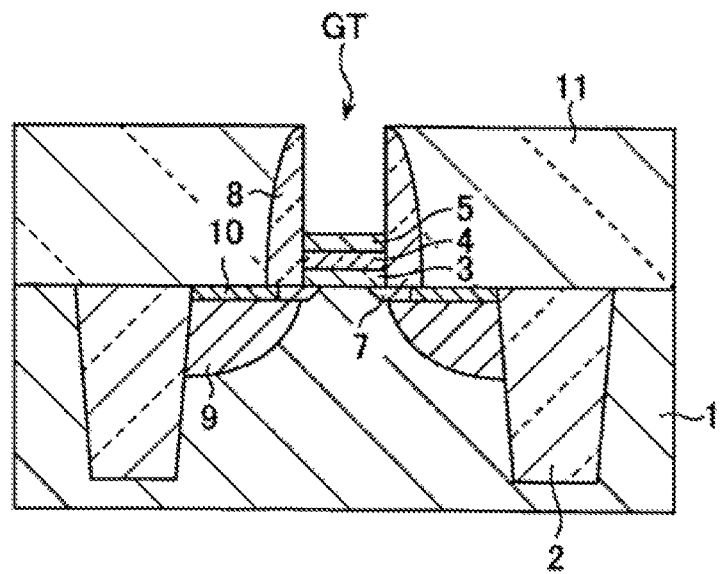

See FIG. 1L. Using, for instance, $CF_4$, $Cl_2$, and $N_2$, the silicon material is etched with high selectivity for silicon oxide to remove the dummy gate electrode 6 so that a gate trench GT for embedding of an actual metallic gate electrode is formed in the interlayer insulating film 11. The WFM film 5 is exposed at the bottom of the gate trench GT. Although the gate trench GT is not the result of etching the interlayer insulating film 11, it can be regarded as a concave portion formed in the interlayer insulating film 11 because it is recessed from the top face of the interlayer insulating film 11

Figure 1M:
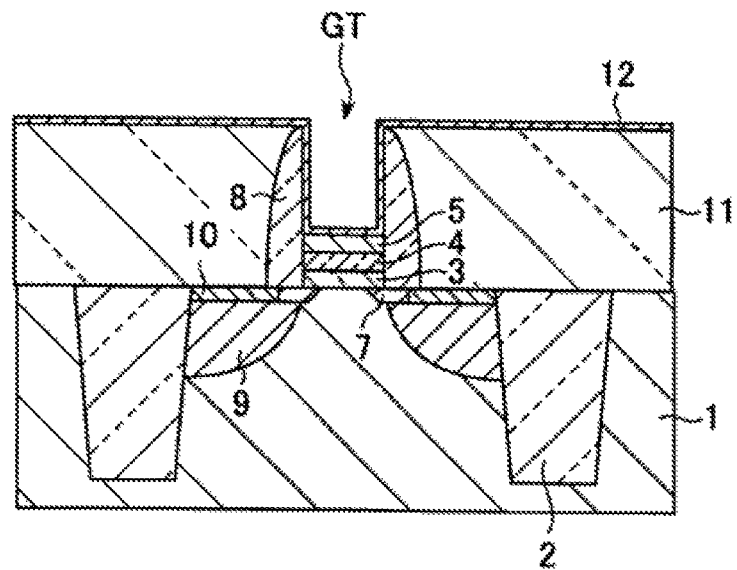

See FIG. 1M. To cover the inner face of the gate trench GT, for instance, a Ta film or a TaN film with a thickness of 1 nm to 10 nm (3 nm for instance) is deposited on the interlayer insulating film 11 by ALD to form a barrier metal film 12. After Al is embedded in the gate trench GT in a later step, the barrier metal film 12 will serve to prevent it from coming in contact with the WFM film 5.

A single MOS transistor is formed in this Embodiment, but if it is applied to a CMOS formation process, the barrier metal film 12 may be formed only for either MOS transistor (P-type MOS transistor, for instance).

Figure 1N:
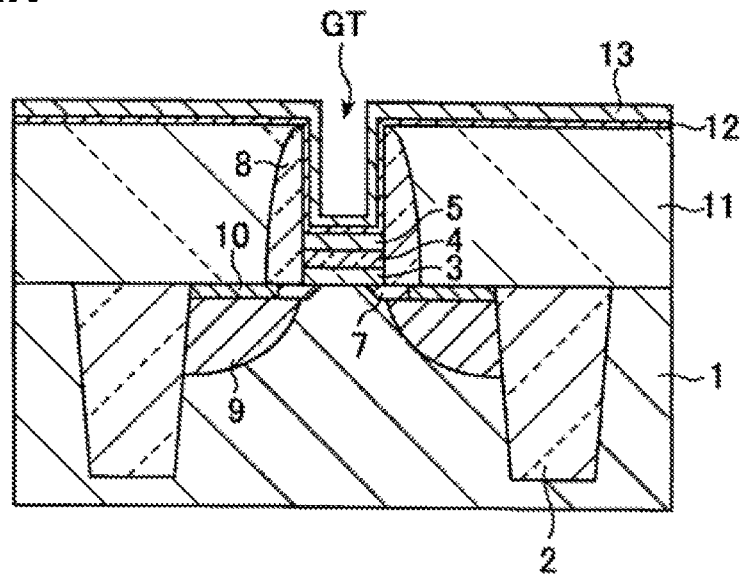

See FIG. 1N. For instance, an Al film with a thickness of 5 nm to 50 nm (10 nm for instance) is deposited on the barrier metal film 12 by CVD to form a gate electrode film 13. More specifically, using, for instance, dimethyl aluminum hydride ($Al(CH_3)2H$, DMAH) and hydrogen as input material gas and reactant gas, respectively, the substrate surface that is maintained at 150° C. to 275° C. (250° C. for instance) is processed by CVD to produce an Al film. The CVD process used here may be a MOCVD process using an organic metal as input material.

As a result of using an organic material to produce a film by CVD, impurities such as C may be contained in the Al film. If C is contained, in particular, the Al film can suffer an increase in resistance. The PVD method, on the other hand, can produce an Al film with a higher purity. In the present Embodiment, an Al film is produced first by the CVD method, which is high in cladding capability. PVD will be performed for the second Al film production described later in FIG. 1Q. All Al films may be produced by PVD in order to minimize impurities in the Al films.

Figure 1O:
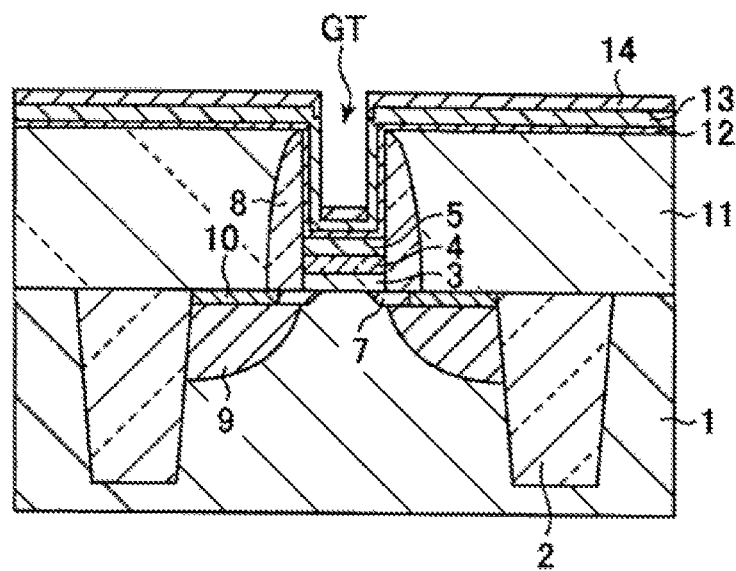

See FIG. 1O. For instance, a TiN film with a thickness of 1 nm to 10 nm (2 nm for instance) is deposited on the gate electrode film 13 by PVD to form a covering film 14. More specifically, this may be carried out by reactive sputtering using a Ti target, Ar gas, and $N_2$ gas. This reactive sputtering may be performed by using $N_2$ gas alone. The collimator sputtering method may be used to achieve higher rectilinearity.

The covering film 14 is formed of a material having a higher melting point than the material used for the gate electrode film 13. This is because, as described below, it is desirable that the gate electrode film 13 is allowed to reflow while preventing the covering film 14 from reflowing.

For a gate electrode film 13 of Al as in this Embodiment, the covering film 14 may be formed of a material such as, for instance, Ti, Ta, TaN, and $Ta_2N$ (Ti, Ta, and nitrides thereof), instead of TiN. It is noted here that TiN, TaN, and $Ta_2N$ are electrically conductive. These materials have the following melting points: Al—660° C., Ti—1670° C., TiN—2,350° C. to 3,290° C., Ta—3,020° C., TaN—1,700° C. to 2,000° C., and $Ta_2N$—2800° C. to 3,000° C. The material used to form the covering film 14 is not necessarily electrically conductive, but it may preferably be electrically conductive because, as described later, part of the covering film 14 will remain in the gate electrode.

It is preferred that the covering film 14 is produced by a high-rectilinearity film production method such as, for instance, PVD. This is because the gate electrode film 13 on the side face of the gate trench GT is preferably left uncovered by the covering film 14 since the gate electrode film 13 will be unable to reflow if the entire surface of the gate electrode film 13 is covered by the covering film 14.

Figure 1P:
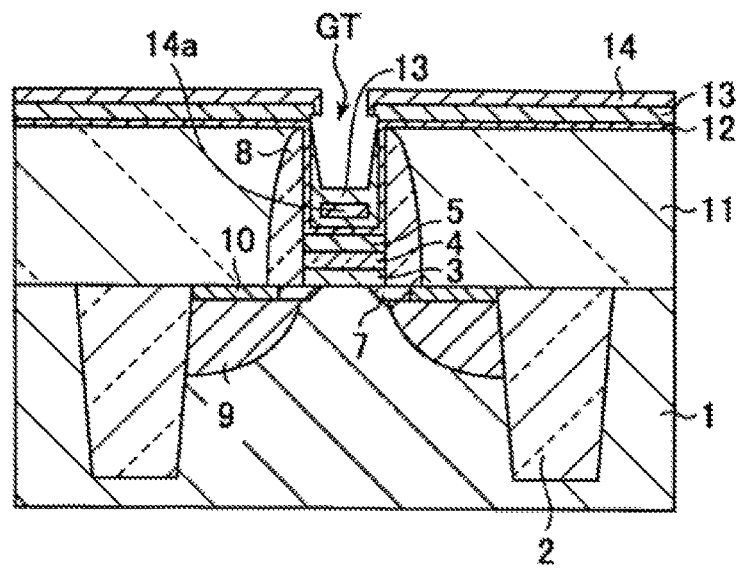

See FIG. 1P. The gate electrode film 13 of Al is allowed to reflow at, for instance, 400° C. The exposed portion of the gate electrode film 13 left uncovered by the covering film 14 on the side face of the gate trench GT reflows to fill the gate trench GT. On the other hand, the gate electrode film 13 on the top face of the interlayer insulating film 11 is prevented from reflowing by the covering film 14 formed on top of it. The covering film 14a formed at the bottom of the gate trench GT is embedded under the gate electrode film 13 that has reflowed.

Described next is Comparative example 1 which adopts a production method to allow the gate electrode film 13 to reflow without forming a covering film 14. In the method used in Comparative example 1, the reflowing material of the gate electrode film 13 tends to build up (coagulate) in shoulder portions at the opening of the gate trench GT. If the gate trench GT is narrower than, for instance, 100 nm, shoulders opposite each other tend to be joined to close the opening of the gate trench GT, leading to voids. The coagulation in shoulder portions is expected to lead to a decrease in the amount of the gate electrode film material that falls down from the side face of the gate trench GT to fill the gate trench GT.

Described next is Comparative example 2 which adopts a production method to form a covering film 14 over the entire face of the gate electrode film 13. In the method used in Comparative example 2, the gate electrode film 13 cannot reflow over the entire face to fill the gate trench GT, although the coagulation in shoulder portions is prevented.

In the method of the Embodiment, the covering film 14 formed on the top face of the interlayer insulating film 11 depresses the reflow of the underlying gate electrode film 13 to prevent the coagulation of the gate electrode film material in shoulder portions. On the other hand, the gate electrode film 13 on the side face of the gate trench GT can reflow to fill the gate trench GT. In view of the features of PVD, the covering film 14 may be formed excessively in and around shoulder portions at the opening of the gate trench GT to cover uppermost portions of its side face. It is expected that this works to prevent more strongly the coagulation of the gate electrode film material in shoulder portions.

Figure 1Q:
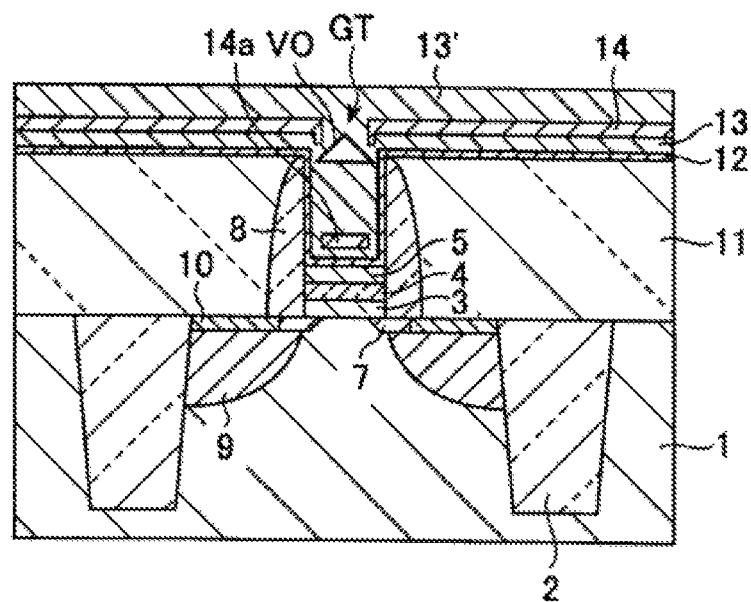

See FIG. 1Q. While an Al film (referred to as the second gate electrode film 13', compared to the gate electrode film 13 produced previously, which is referred to as the first gate electrode film 13) is deposited by PVD on the gate trench GT and on the covering film 14 formed on the top face of the interlayer insulating film 11, the Al film is allowed to reflow to fill the gate trench GT. For instance, film production and reflow are performed simultaneously by starting Al film production on a stage heated at, for instance, 200° C. followed by increasing the temperature up to 400° C. while continuing the film production. Here, the production and reflow of the second gate electrode film 13' will not be necessary if the gate trench GT has been filled sufficiently as a result of the production and reflow of the first gate electrode film 13.

If the size of the gate trench is 90 nm or less, voids VO tend to form in the upper portion of the gate trench GT during the combined film production and reflow process. These voids VO, however, can be removed in the CMP process carried out at a later step.

Figure 1R:
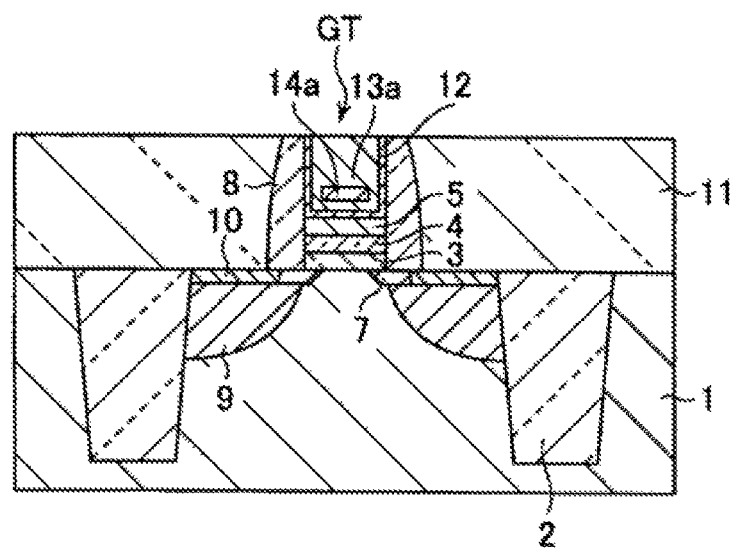

See FIG. 1R. The unnecessary portions of the gate electrode film 13', covering film 14, gate electrode film 13, and barrier metal film 12 on the interlayer insulating film 11 are removed by CMP to expose the interlayer insulating film 11. To remove the barrier metal film 12 from the top face of the interlayer insulating film 11, the top face of the interlayer insulating film 11 may be overpolished to the extent that a thin layer is scraped off. If CMP is performed in this way, it will allow the voids VO in the upper portion of the gate trench GT, if existing, to be removed easily from the completed device structure. Another heat treatment of, for instance, 400° C. may be performed before this CMP in order to achieve a uniform Al grain size and a constant polishing rate. Thus, a gate electrode 13a embedded in a gate trench GT is completed.

Figure 1S:
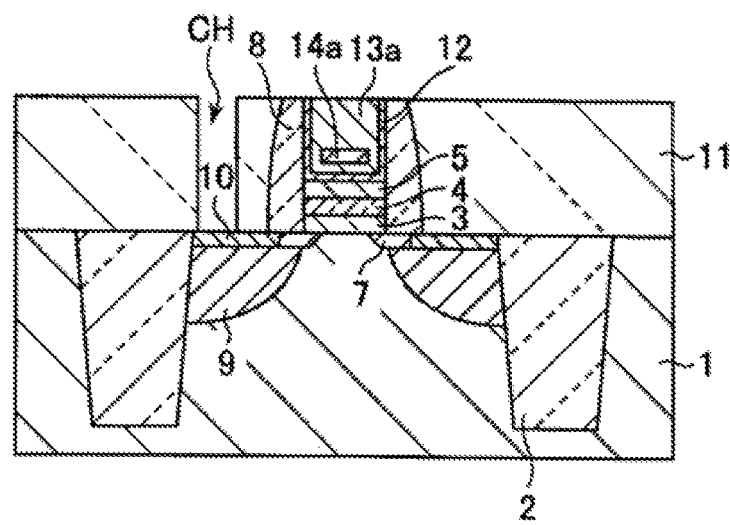

See FIG. 1S. By carrying out photolithography and dry etching, a contact hole CH is formed in the interlayer insulating film 11 to expose the source/drain region 9 of the MOS transistor. The etching gas used may be, for instance, $C_4F_6$, Ar, CO, and $O_2$.

Figure 1T:
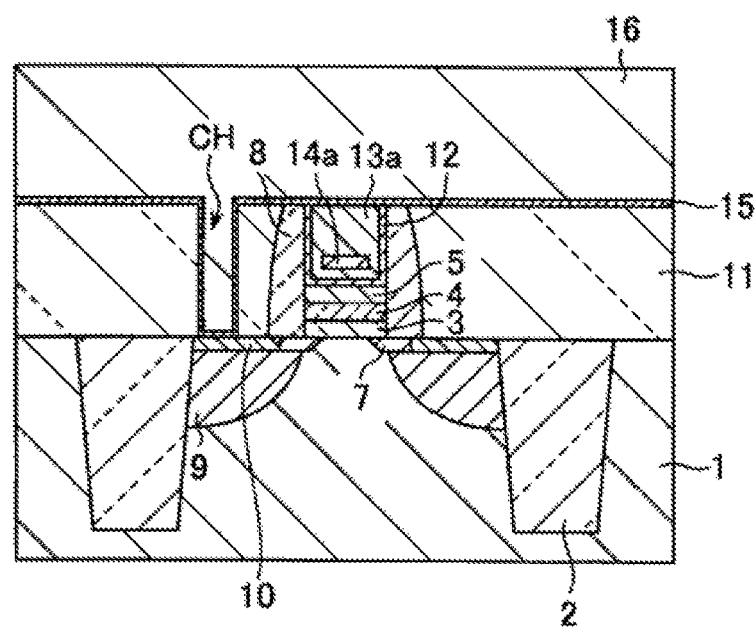

See FIG. 1T. To cover the inner face of the contact hole CH, a film of Ti or TiN, or a laminated film thereof is deposited by, for instance, CVD on the interlayer insulating film 11 to form a glue layer 15. A W film is deposited by, for instance, CVD on the glue layer 15 to form a contact plug metal film 16 to fill the contact hole CH.

Figure 1U:
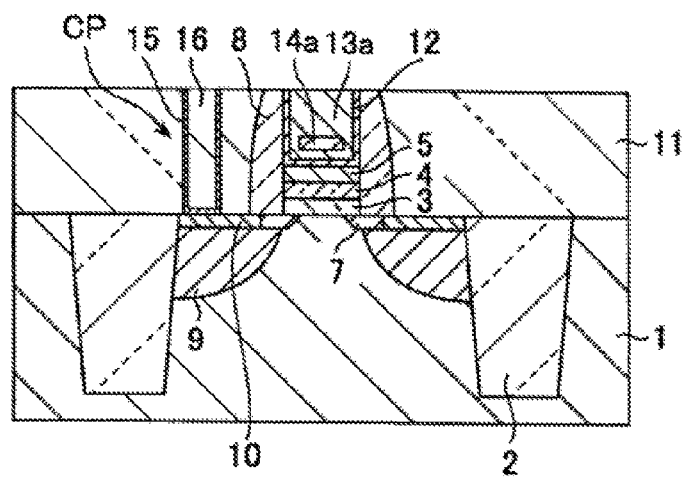
Figure 1V:
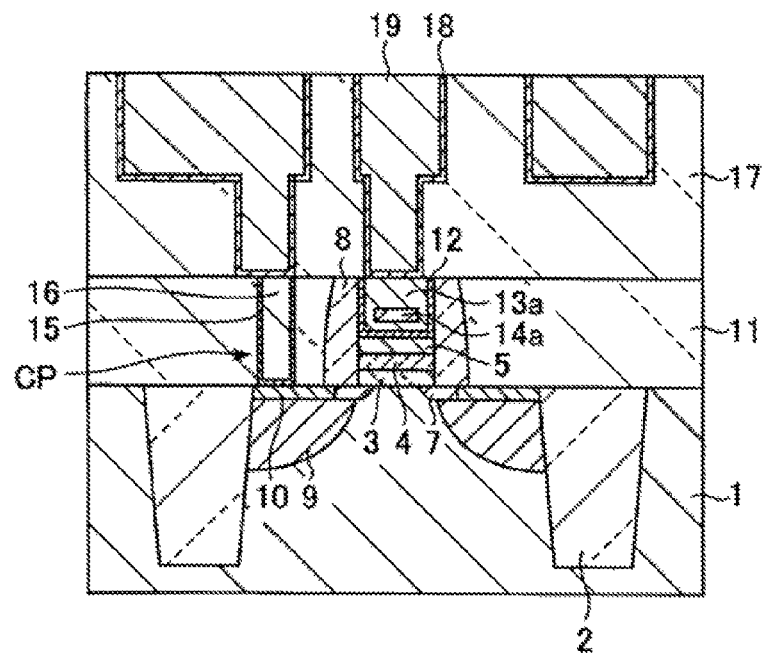

See FIG. 1U. The unnecessary portions of the contact plug metal film 16 and the glue layer 15 on the interlayer insulating film 11 are removed to expose the interlayer insulating film 11. Thus, a contact plug CP is formed.

See FIG. 1V. In addition, an interlayer insulating film 17 is formed, and electrically conductive members 19 respectively containing a copper plug and copper wiring are formed by dual damascene in the interlayer insulating film 17 with barrier metal films 18. Some of the electrically conductive members 19 are connected with the contact plug CP, and some of the electrically conductive members 19 are connected with gate electrode 13a of the MOS transistor.

More specifically, the material used to form the interlayer insulating film 17 may be selected from various generally known low dielectric constant materials. The barrier metal film 18 is formed by, for instance, PVD to deposit a film of Ta, TaN, Ti, or TiN, or a laminated film thereof. The electrically conductive member 19 containing a copper plug and copper wiring is formed by producing a seed film of Cu or a Cu alloy such as Cu—Mn deposited by, for instance, PVD, producing another Cu film by copper plating using the seed film as electrode, and removing the unnecessary portions of the Cu film and seed film by CMP. The barrier metal film 18 and the seed film can be produced by CVD or ALD, instead of PVD. The Cu film can be produced by CVD instead of plating.

If the covering film 14a formed has a large thickness, Ti may be separated out on the surface of the gate electrode 13a before this wiring structure production step as a result of the influence of oxygen in the atmosphere or the influence of heat used to produce the interlayer insulating film 17.

Subsequently, various generally known techniques are available for use to add an upper wiring structure to produce a multi-layered wiring structure. Thus, the semiconductor device of Embodiment 1 is completed.

As described above, the covering film functions to depress the reflow of the gate electrode film. If C impurities are contained in the Al-based gate electrode film, they work to increase the resistance of the gate electrode. As described below, it is possible to produce a covering film that functions to getter C to depress the resistance increase of the gate electrode.

Figure 2:
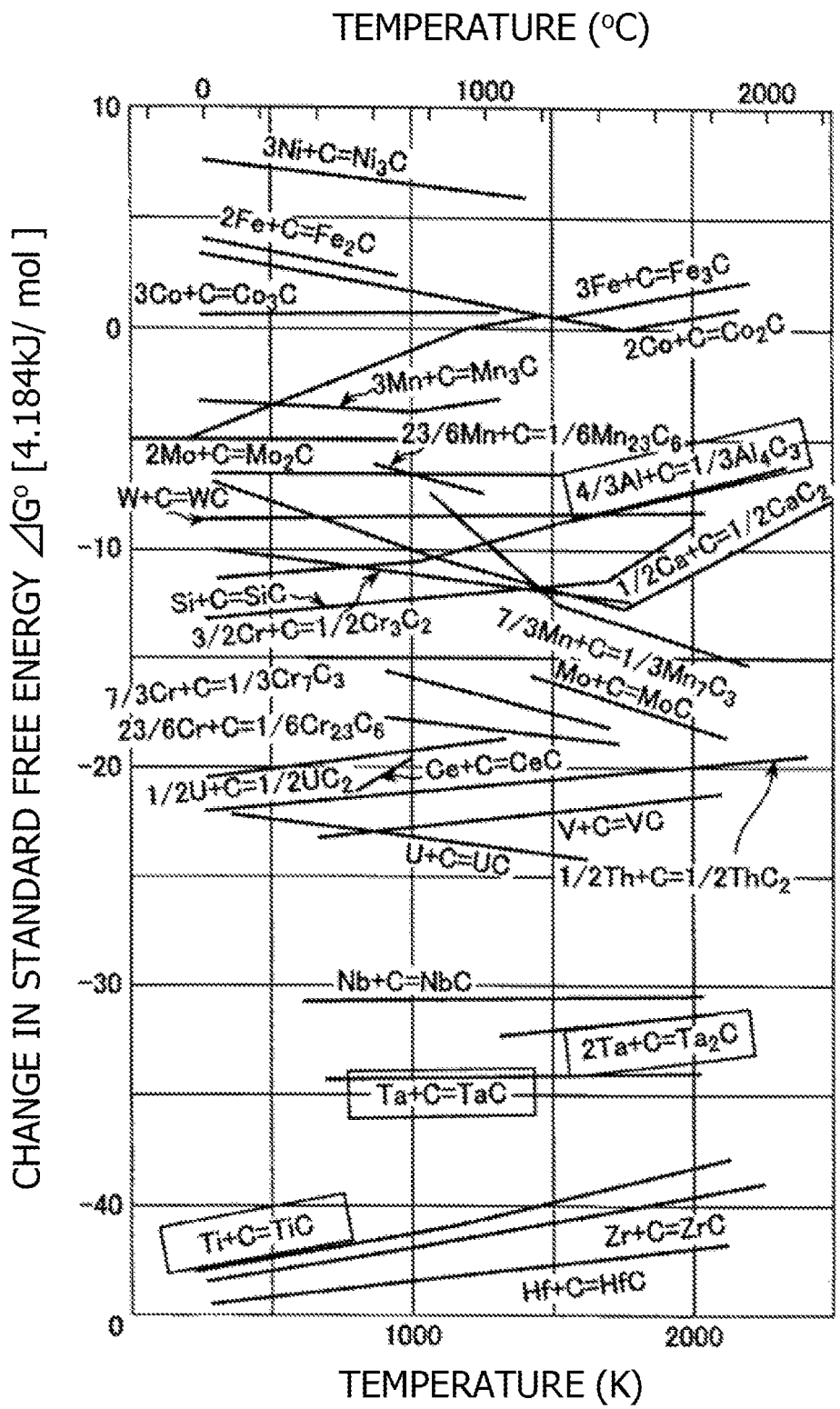
FIG. 2 illustrates curves illustrating changes in standard free energy in the carbide formation reactions of various substances.

FIG. 2 illustrates curves that illustrate changes in standard free energy in the carbide formation reactions of various substances (cited from J. Japan Inst. Metals, 8 (1969), 49). The vertical axis and the horizontal axis represent the standard free energy change and the temperature, respectively. Substances located at lower positions along the vertical axis have larger decrease in standard free energy and form more stable carbides when reacting with C.

It is seen that Ti and Ta, for instance, can form more stable carbides than Al can. It is assumed that substances that form more stable carbides tend to have higher capability to getter C. This suggests that covering films containing, for instance, Ti or Ta can work to getter C from the Al-based gate electrode film and depress the resistance increase in the gate electrode film caused by C.

In Embodiment 1, the heat treatment during the Al film reflow step illustrated in FIG. 1P, the Al film production and reflow step illustrated in FIG. 1Q, and the Al grain size adjustment step prior to CMP illustrated in FIG. 1R accelerates the gettering of C by Ti in the covering film, leading to a resistance decrease of the gate electrode film.

As described above, in a MOS transistor production method having a step of embedding a gate electrode in a gate trench, the use of a material with a higher melting point than the gate electrode film material to form a covering film that covers the gate electrode film but leaves the side face of the gate trench partly uncovered serves to depress the coagulation of the gate electrode film material in shoulder portions at the opening during reflow of the gate electrode film, leading to successful filling of the gate trench.

Furthermore, if the material of the covering film has a higher capability to getter impurities that act to increase the resistance of the gate electrode than the gate electrode film material, it serves to prevent the resistance of the gate electrode from being increased by the impurities.

Apparently, the technique described in the Embodiment is not limited to the gate electrode film of Al. It can be applied to other electrically conductive materials (Al—Cu alloy for instance, in addition to Al) that can reflow to fill the gate trench.

If, for instance, a gate electrode containing Al is to be produced, it is particularly preferable that a material that contains Ti or Ta is used to form the covering film. This is because Ti, Ta, and their nitrides, for instance, have a higher melting point than Al, and a high capability to getter C from Al-containing materials and to make a good contact with Al, possibly allowing Al to move easily onto the covering film at the bottom of the gate trench. In addition, they are widely used in semiconductor production processes and much knowhow is available about, for instance, countermeasures against pollution they can cause.

Described next is Embodiment 2. In Embodiment 1, a high-k first process is adopted to form a high dielectric constant insulating film before removing the dummy gate electrode. In Embodiment 2, a high-k last process is adopted to form a high dielectric constant insulating film after removing the dummy gate electrode, as described below.

FIGS. 3A to 3M illustrate schematic cross sections of major steps in the semiconductor device production method of Embodiment 2. The same numbering as in Embodiment 1 is used for members and structures that correspond clearly to similar ones in Embodiment 1.

Figure 3A:
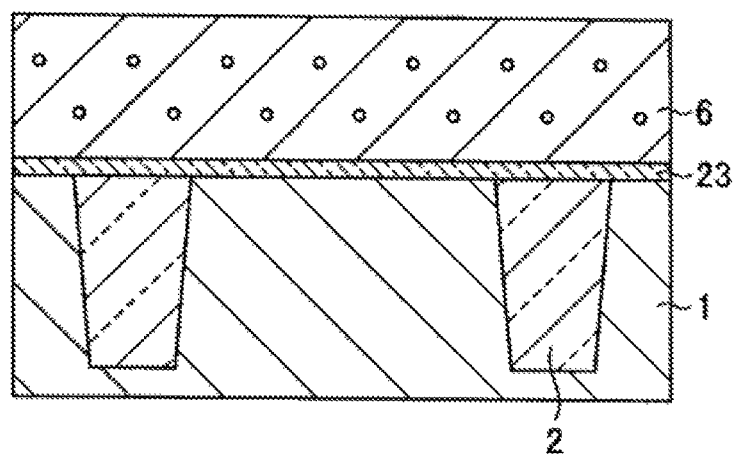
FIGS. 3A to 3M illustrate schematic cross sections that illustrate major steps of the semiconductor device production method in Embodiment 2.

See FIG. 3A. First, an element insulating film 2 is formed on a silicon substrate 1 as in Embodiment 1. Then, a dummy insulating film 23 is formed on the silicon substrate 1 as in the step of forming the base insulating film 3 in Embodiment 1. A dummy gate electrode film 6 is formed on a dummy insulating film 23 as in the step of forming the dummy gate electrode film 6 in Embodiment 1.

Figure 3B:
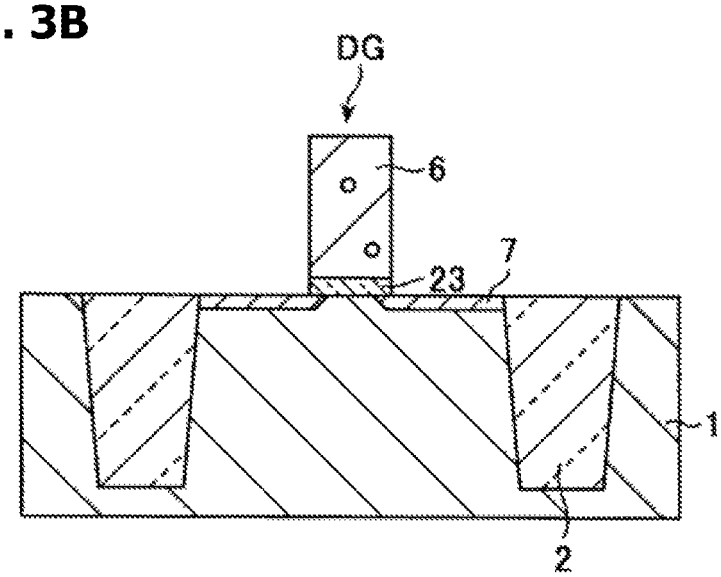

See FIG. 3B. A dummy gate electrode film 6 and a dummy insulating film 23 are patterned by photolithography and dry etching to form a dummy insulation gate electrode structure DG. Using the dummy insulation gate electrode structure DG as mask, impurities are injected to form a low concentration region 7.

Figure 3C:
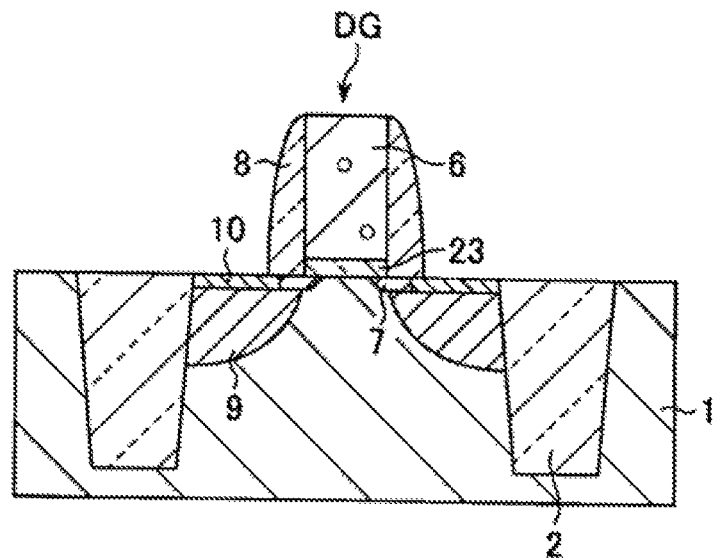

See FIG. 3C. A side wall spacer 8 is formed on the side wall of the dummy insulation gate electrode structure DG as in the step of forming the side wall spacer 8 in Embodiment 1. Using the dummy insulation gate electrode structure DG and the side wall spacer 8 as masks, impurities are injected to form a high concentration source/drain region 9. A silicide film 10 is formed on the surface of the high concentration source/drain region 9.

Figure 3D:
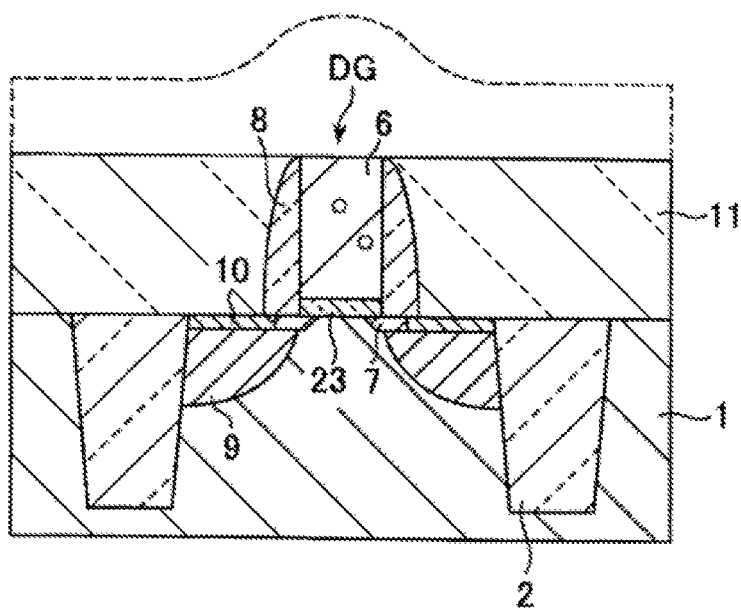

See FIG. 3D. An interlayer insulating film 11 is formed on the silicon substrate 1 to cover the dummy insulation gate electrode structure DG as in the step of forming the interlayer insulating film 11 in Embodiment 1. The upper portion of the interlayer insulating film 11 is removed by CMP to expose the top face of the dummy gate electrode 6.

Figure 3E:
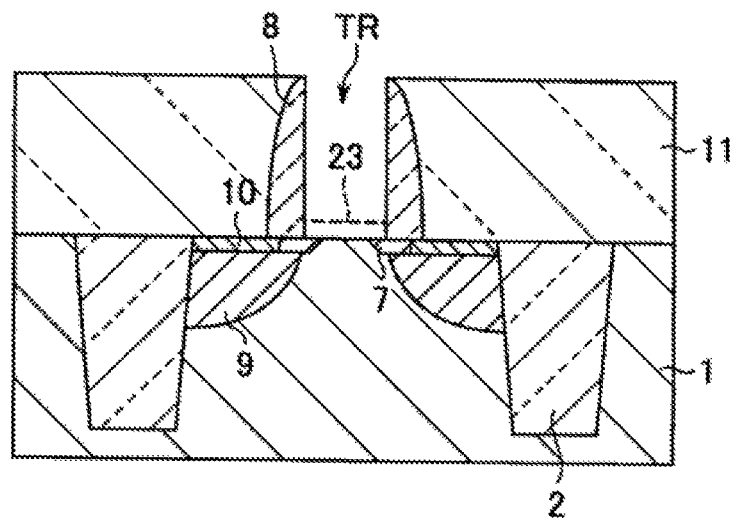

See FIG. 3E. The silicon material is etched with high selectivity for silicon oxide to remove the dummy gate electrode 6 as in the step of removing the dummy gate electrode 6 in Embodiment 1. As a result, the dummy insulating film 23 is exposed at the bottom of the concave portion TR left after the removal of the dummy gate electrode 6.

Furthermore, the dummy insulating film 23 is removed by, for instance, etching it with a 1% HF solution for 15 to 30 seconds. As a result, the silicon substrate 1 is exposed at the bottom of the concave portion TR left after the removal of the dummy gate electrode 6 and the dummy insulating film 23.

The dummy insulating film 23 may be left unremoved in order to use it as base insulating film for laminated gate insulating film. However, the dummy insulating film 23 can be easily damaged due to the etching to remove the dummy gate electrode 6, and therefore, a base insulating film for the laminated gate insulating film is newly produced in this Embodiment as described later. If damage can be avoided, the dummy insulating film 23 may be left unremoved to use it as base insulating film for the laminated gate insulating film.

Figure 3F:
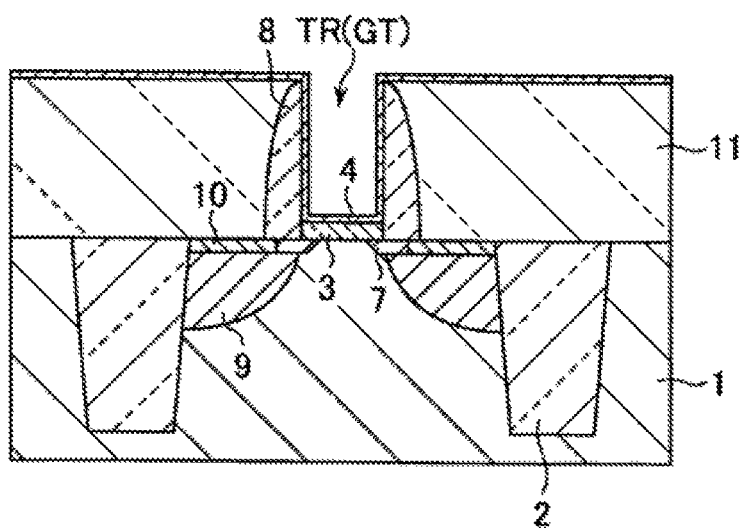

See FIG. 3F. For instance, a base insulating film 3 is formed by subjecting the silicon substrate 1 exposed at the bottom of the concave portion TR to thermal oxidation at 400° C. to grow a silicon oxide film. The silicon oxide film for the base insulating film 3 may be formed by CVD or ALD.

To cover the inner face of the concave portion TR, for instance, a hafnium oxide film with a thickness of 0.5 nm to 3 nm is deposited by ALD, CVD, or PVD on the interlayer insulating film 11 to form a high dielectric constant insulating film 4. After the production of the hafnium oxide film, conditioning of the hafnium oxide film may be performed by heat treatment at 300° C. to 500° C. Here, one or more of the group of Zr, Ti, Al, Si, Ta, La, Y, and Mg may be added in a range where the threshold voltage is controllable. Nitrogen plasma treatment may also be performed to nitride it by annealing at 350° C. to 500° C.

The high dielectric constant insulating film 4 is formed on top of the base insulating film 3 at the bottom of the concave portion TR to form a laminated gate insulating film. To clearly distinguish between the high-k first process in Embodiment 1 and the high-k last process in Embodiment 2, the concave portion TR after the formation of the high dielectric constant insulating film 4 is referred to as the gate trench GT in the description of Embodiment 2.

Figure 3G:
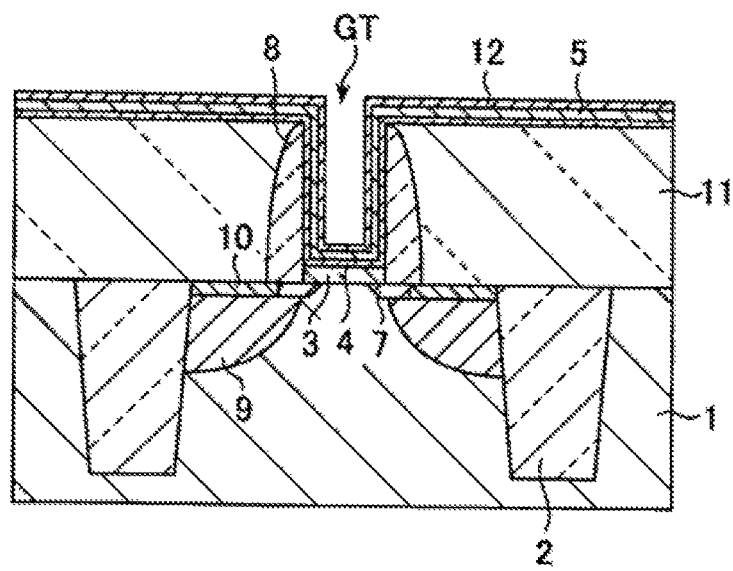

See FIG. 3G. A WFM film 5 is formed on the high dielectric constant insulating film 4 as in the step of forming the WFM film 5 in Embodiment 1. Furthermore, a barrier metal film 12 is formed on the WFM film 5 as in the step of forming the barrier metal film 12 in Embodiment 1.

Figure 3H:
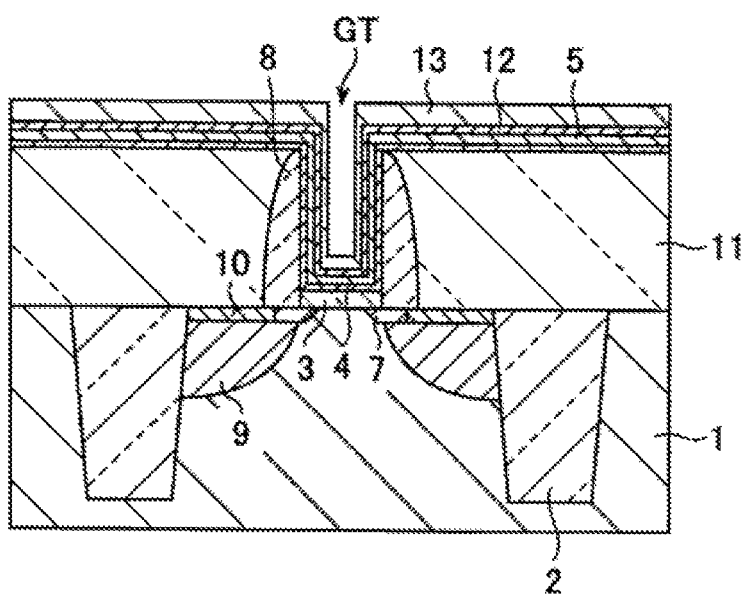

See FIG. 3H. A gate electrode film 13 is formed on the barrier metal film 12 as in the step of forming the gate electrode film 13 in Embodiment 1.

Figure 3I:
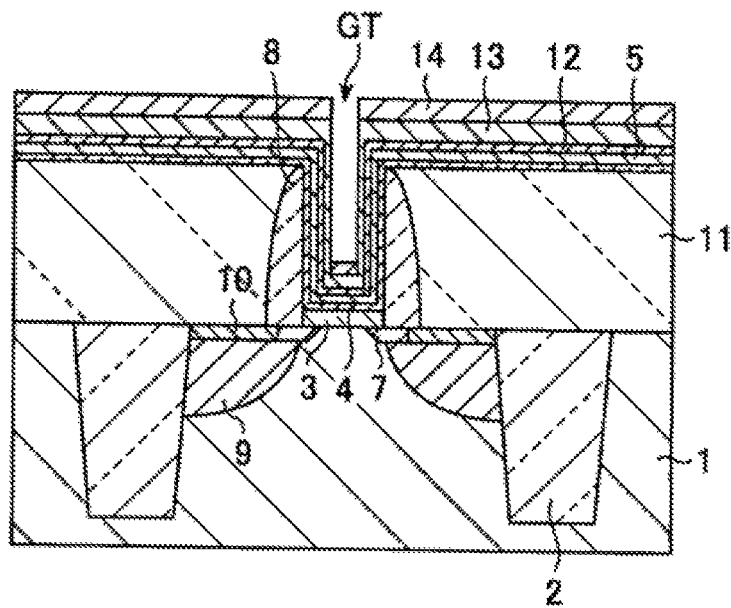

See FIG. 3I. A covering film 14 is formed on the gate electrode film 13 as in the step of forming the covering film 14 in Embodiment 1. The gate electrode film 13 is covered by the covering film 14 at the bottom of the gate trench GT and above the interlayer insulating film 11 while the gate electrode film 13 is exposed without being covered by the covering film 14 on the side face of the gate trench GT, as in Embodiment 1.

Figure 3J:
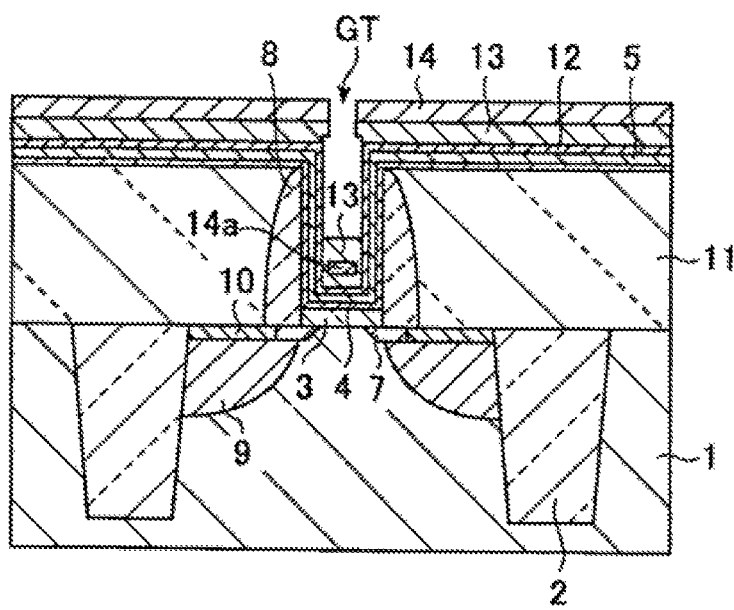

See FIG. 3J. The gate electrode film 13 is allowed to reflow as in the reflow step (see FIG. 1P) for the gate electrode film 13 in Embodiment 1. The exposed portion of the gate electrode film 13 left uncovered by the covering film 14 is allowed to reflow to fill the gate trench GT.

Figure 3K:
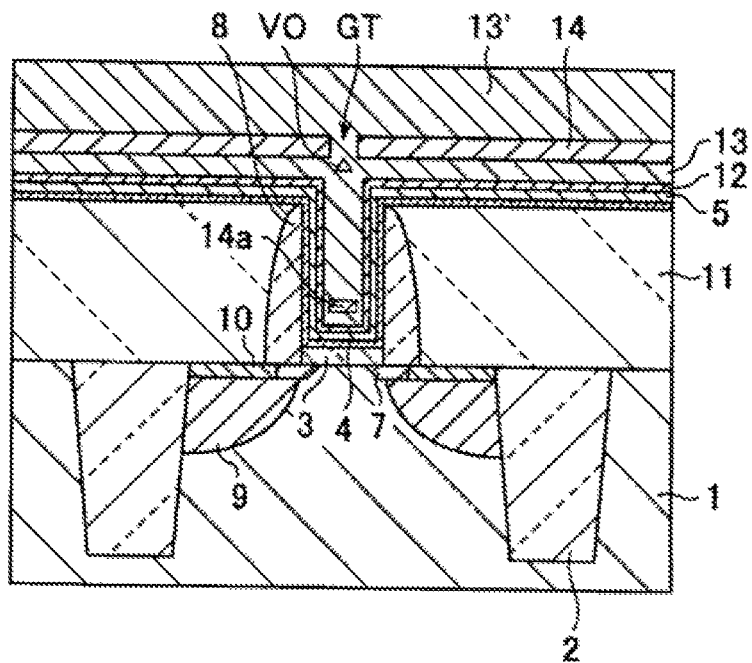

See FIG. 3K. A gate electrode film 13' is produced and allowed to reflow to fill the gate trench GT as in the production and reflow steps for the second gate electrode film 13' in Embodiment 1 (see FIG. 1Q).

Figure 3L:
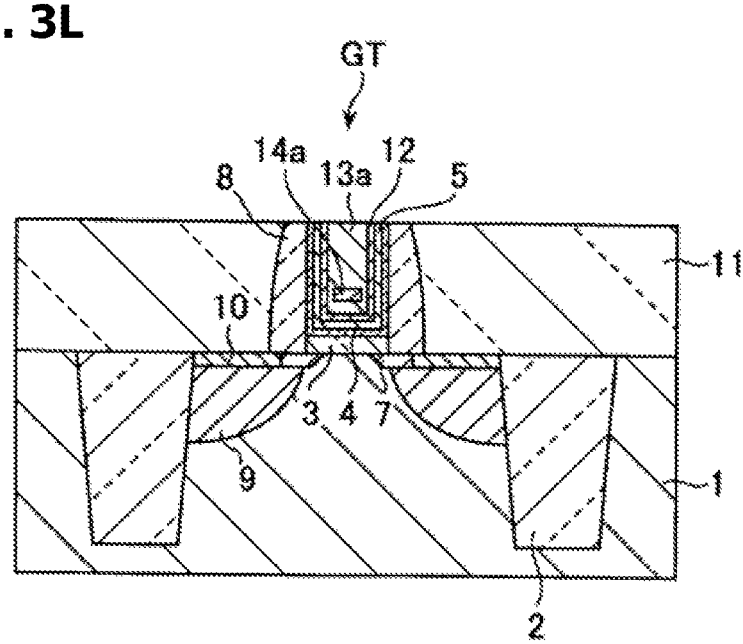

See FIG. 3L. The unnecessary portions of the gate electrode film 13', covering film 14, gate electrode film 13, barrier metal film 12, WFM film 5, and high dielectric constant insulating film 4 are removed to expose the interlayer insulating film 11, leaving the gate electrode 13a to fill the gate trench GT, as in the CMP step illustrated in FIG. 1R for Embodiment 1.

Figure 3M:
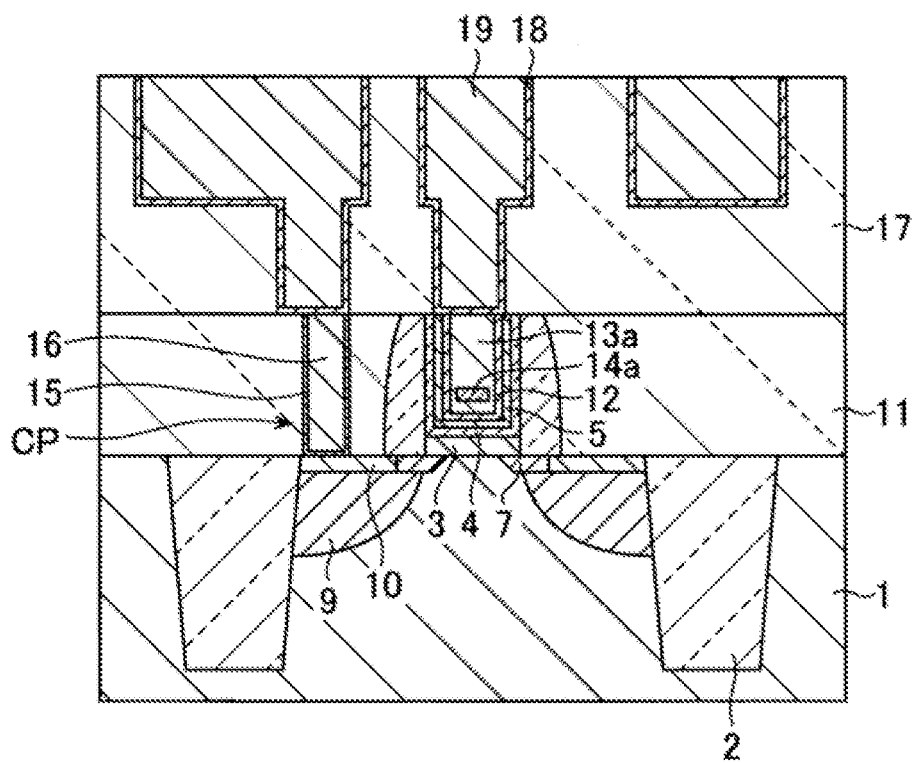

See FIG. 3M. Subsequently, a multi-layered wiring structure is formed as in the steps illustrated in and after FIG. 1S for Embodiment 1. Thus, a semiconductor device of Embodiment 2 is produced.

In the high-k last process in Embodiment 2 as well, the filling of the gate trench may be performed by causing the gate electrode film to reflow while controlling the reflow region by the covering film as in the case of the high-k first process in Embodiment 1. Also similarly, the covering film can function to getter impurities that increase the resistance of the gate electrode.

The procedures used in Embodiments 1 and 2 can be roughly summarized as follows. A concave portion to embed a gate electrode is formed in an insulating film on a semiconductor substrate. A gate insulating film is formed at the bottom of the concave portion either by a high-k first process as in Embodiment 1 or by a high-k last process as in Embodiment 2.

A gate electrode film is formed on the inner wall of the concave portion and on the top face of the insulating film. A material having a higher melting point than the electrically conductive material that constitutes the gate electrode film is used to form a covering film on the gate electrode film, leaving part of the side face of the concave portion uncovered. Then, heat treatment is performed to allow the gate electrode film to reflow.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device production method comprising:
   forming an insulating film on a semiconductor substrate,
   forming a concave portion in the insulating film,
   forming a gate insulating film at bottom of the concave portion, the bottom being on the semiconductor substrate;
   forming a first gate electrode film over the gate insulating film, over an inner wall surface of the concave portion, and over a top face of the insulating film, the first gate electrode film being made of an electrically conductive material containing a first metal;
   after the forming a first gate electrode film, forming a covering film over the first gate electrode film, the covering film being made of a material having a second melting point higher than a first melting point of the electrically conductive material, the first gate electrode film on the inner wall surface of the concave portion being uncovered with the covering film; and
   after the forming a covering film, performing heat treatment to reflow the first gate electrode film.

2. The semiconductor device production method according to claim 1 wherein the covering film formation uses physical vapor deposition to form the covering film.

3. The semiconductor device production method according to claim 1 wherein the first gate electrode film formation uses chemical vapor deposition to form the gate electrode film.

4. The semiconductor device production method according to claim 1 wherein the material that constitutes the covering film has a higher capability to getter impurities that increase the resistance of the first gate electrode film than the electrically conductive material that constitutes the first gate electrode film.

5. The semiconductor device production method according to claim 1 wherein the first metal is Al.

6. The semiconductor device production method according to claim 5 wherein the material that constitutes the covering film contains Ti, Ta, or a nitride thereof.

7. The semiconductor device production method according to claim 1 wherein the reflow of the first gate electrode film is followed by polishing to remove the covering film and the first gate electrode film existing on the insulating film.

8. The semiconductor device production method according to claim 1 wherein the reflow of the first gate electrode film is followed by forming a second gate electrode film of an electrically conductive material containing the first metal on the concave portion and performing heat treatment to reflow the second gate electrode film.

9. The semiconductor device production method according to claim 1 wherein a work function metal film exists between the first gate electrode film and the gate insulating film when carrying out the first gate electrode film formation.

10. The semiconductor device production method according to claim 9 wherein a barrier metal film exists between the first gate electrode film and the work function metal film when carrying out the first gate electrode film formation.

11. The semiconductor device production method according to claim 1 wherein the forming an insulating film on a semiconductor substrate, a concave portion in the insulating film, and a gate insulating film at the bottom of the concave portion, the bottom being on the semiconductor substrate, comprises:
   forming the gate insulating film on the semiconductor substrate;
   forming a dummy gate electrode above the gate insulating film;
   forming the insulating film to cover the dummy gate electrode;
   polishing the insulating film to expose the dummy gate electrode; and
   removing the dummy gate electrode to form a concave portion in the insulating film.

12. The semiconductor device production method according to claim 11 wherein the forming the gate insulating film comprises forming a base insulating film on the semiconductor substrate and forming a hafnium oxide film on the base insulating film.

13. The semiconductor device production method according to claim 11 wherein forming a work function metal film on the gate insulating film is carried out between the forming the gate insulating film and the forming the dummy gate electrode, and the forming the dummy gate electrode comprises forming the dummy gate electrode on the work function metal film.

14. The semiconductor device production method according to claim 1 wherein the forming an insulating film on a semiconductor substrate, a concave portion in the insulating film, and a gate insulating film at the bottom of the concave portion, the bottom being on the semiconductor substrate, comprises:
   forming a dummy gate electrode above the semiconductor substrate;
   forming the insulating film to cover the dummy gate electrode;
   polishing the insulating film to expose the dummy gate electrode;
   removing the dummy gate electrode to form a concave portion in the insulating film; and
   forming the gate insulating film at least at the bottom of the concave portion.

15. The semiconductor device production method according to claim 14 wherein the forming the dummy gate electrode is preceded by forming a dummy insulating film on the semiconductor substrate, the forming the dummy gate electrode comprising forming the dummy gate electrode on the dummy insulating film, the forming the concave portion on the insulating film comprising removing the dummy gate electrode and also removing the dummy insulating film, and forming the gate insulating film comprising forming a base insulating film at the bottom of the concave portion and forming a hafnium oxide film on the base insulating film.

* * * * *